(12) United States Patent
McCarten et al.

(10) Patent No.: US 8,618,458 B2
(45) Date of Patent: Dec. 31, 2013

(54) BACK-ILLUMINATED CMOS IMAGE SENSORS

(75) Inventors: John P. McCarten, Penfield, NY (US); Joseph R. Summa, Hilton, NY (US); Cristian A. Tivarus, Rochester, NY (US); Todd J. Anderson, Fairport, NY (US); Eric G. Stevens, Webster, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 807 days.

(21) Appl. No.: 12/266,764

(22) Filed: Nov. 7, 2008

(65) Prior Publication Data

US 2010/0116971 A1    May 13, 2010

(51) Int. Cl.
    *H01L 27/00*    (2006.01)
(52) U.S. Cl.
    USPC ........ 250/208.1; 257/228; 257/447; 257/460; 438/48
(58) Field of Classification Search
    USPC ............... 250/208.1; 257/128, 460, 228, 447; 438/22, 48, 142
    See application file for complete search history.

(56) References Cited

U.S. PATENT DOCUMENTS

| | | | |
|---|---|---|---|
| 4,672,455 A | 6/1987 | Miyatake | |
| 4,774,557 A * | 9/1988 | Kosonocky | 257/222 |
| 4,851,890 A | 7/1989 | Miyatake | |
| 5,238,864 A | 8/1993 | Maegawa et al. | |
| 6,168,965 B1 | 1/2001 | Malinovich et al. | |
| 6,423,993 B1 | 7/2002 | Suzuki et al. | |
| 7,101,726 B2 | 9/2006 | Yamamoto et al. | |
| 7,166,878 B2 * | 1/2007 | Janesick et al. | 257/290 |
| 7,265,397 B1 * | 9/2007 | Tower et al. | 257/223 |
| 8,110,856 B2 * | 2/2012 | Maruyama et al. | 257/228 |
| 2001/0006237 A1 | 7/2001 | Abe | |
| 2002/0125513 A1 | 9/2002 | Inoue | |
| 2002/0148967 A1 * | 10/2002 | Iwanczyk et al. | 250/370.11 |

(Continued)

FOREIGN PATENT DOCUMENTS

| | | |
|---|---|---|
| CN | 1716628 A | 1/2006 |
| EP | 1 028 470 A2 | 8/2000 |

(Continued)

OTHER PUBLICATIONS

U.S. Appl. No. 12/054,505, filed Mar. 25, 2008, Stevens et al.

(Continued)

*Primary Examiner* — Seung C Sohn
*Assistant Examiner* — Kevin Wyatt
(74) *Attorney, Agent, or Firm* — Blakely Sokoloff Taylor & Zafman LLP

(57) ABSTRACT

A back-illuminated image sensor includes a sensor layer disposed between an insulating layer and a circuit layer electrically connected to the sensor layer. An imaging area includes a plurality of photodetectors is formed in the sensor layer and a well that spans the imaging area. The well can be disposed between the backside of the sensor layer and the photodetectors, or the well can be a buried well formed adjacent to the backside of the sensor layer with a region including formed between the photodetectors and the buried well. One or more side wells can be formed laterally adjacent to each photodetector. The dopant in the well has a segregation coefficient that causes the dopant to accumulate on the sensor layer side of an interface between the sensor layer and the insulating layer.

6 Claims, 13 Drawing Sheets

(56) References Cited

U.S. PATENT DOCUMENTS

| | | |
|---|---|---|
| 2005/0199976 A1* | 9/2005 | Iguchi .................... 257/458 |
| 2005/0280095 A1* | 12/2005 | Nabatame et al. ........... 257/369 |
| 2006/0011808 A1* | 1/2006 | Li et al. .................. 250/208.1 |
| 2006/0043519 A1* | 3/2006 | Ezaki ..................... 257/461 |
| 2006/0145202 A1 | 7/2006 | Sawase et al. |
| 2006/0186560 A1 | 8/2006 | Swain et al. |
| 2006/0197007 A1* | 9/2006 | Iwabuchi et al. ......... 250/208.1 |
| 2006/0226438 A1 | 10/2006 | Katsuno et al. |
| 2006/0244020 A1 | 11/2006 | Lee |
| 2007/0108371 A1 | 5/2007 | Stevens et al. |
| 2007/0235829 A1 | 10/2007 | Levine et al. |

FOREIGN PATENT DOCUMENTS

| | | | |
|---|---|---|---|
| EP | 1 612 863 | A2 | 1/2006 |
| EP | 1 653 521 | A1 | 5/2006 |
| WO | WO 2005/046207 | A2 | 5/2005 |

OTHER PUBLICATIONS

PCT/US2009/005989—Partial International Search, mailed Mar. 19, 2010 (5 pages).

PCT/US2009/005989—Preliminary Report on Patentability, mailed May 19, 2011 (10 pages).

PCT/US2009/005989—International Search Report and Written Opinion of the International Searching Authority, dated Mar. 10, 2010 (17 pages).

CN 200980154359.1—First Chinese Office Action with English Translation and Search Report, mailed Apr. 8, 2013 (17 pages).

* cited by examiner

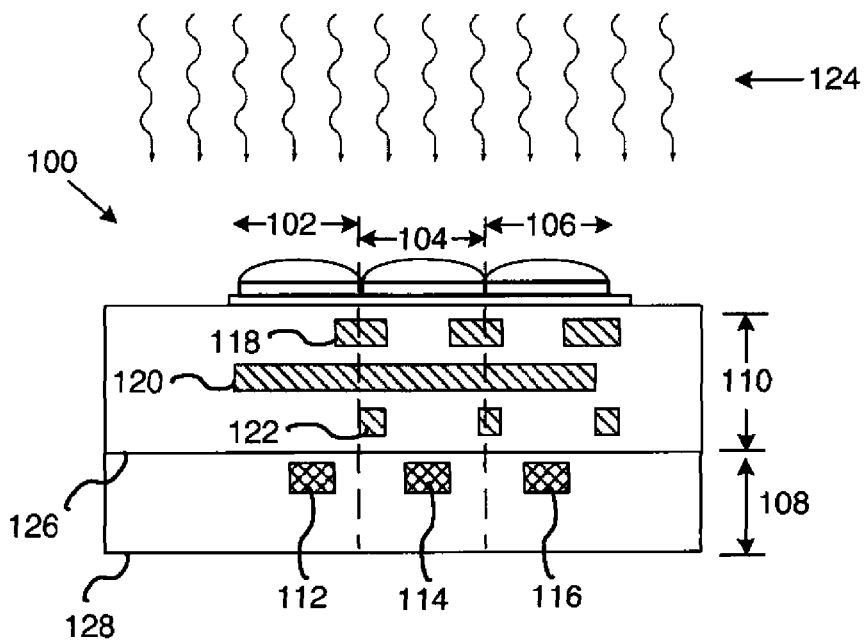
FIG. 1 - Prior Art
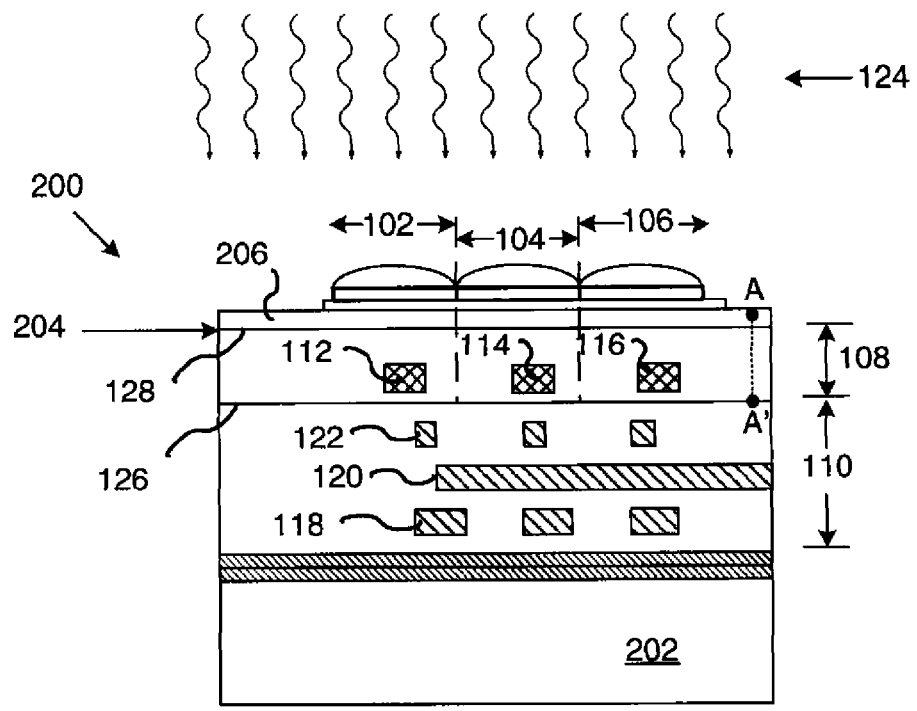
FIG. 2 - Prior Art

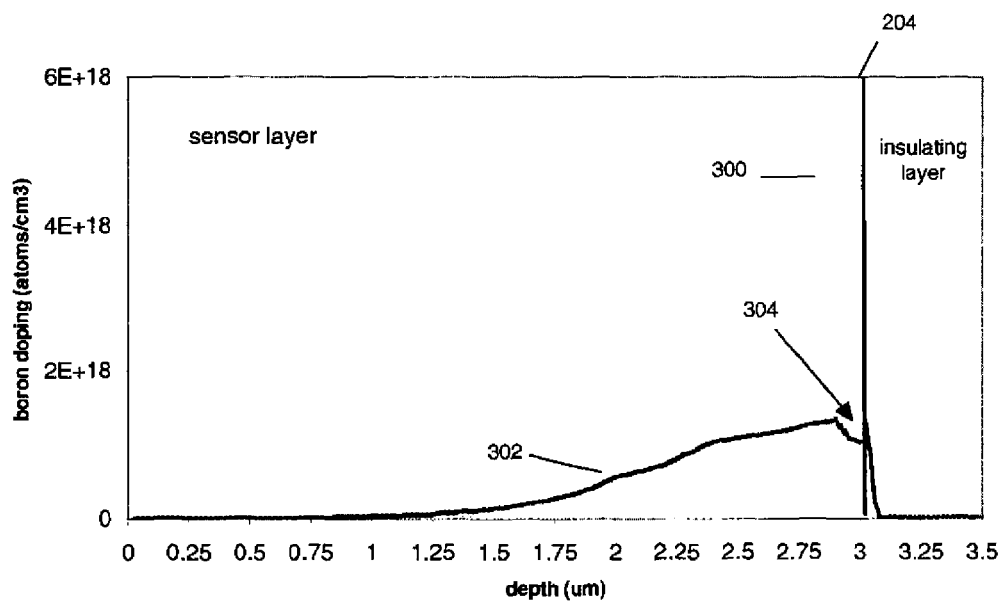
FIG. 3 - Prior Art
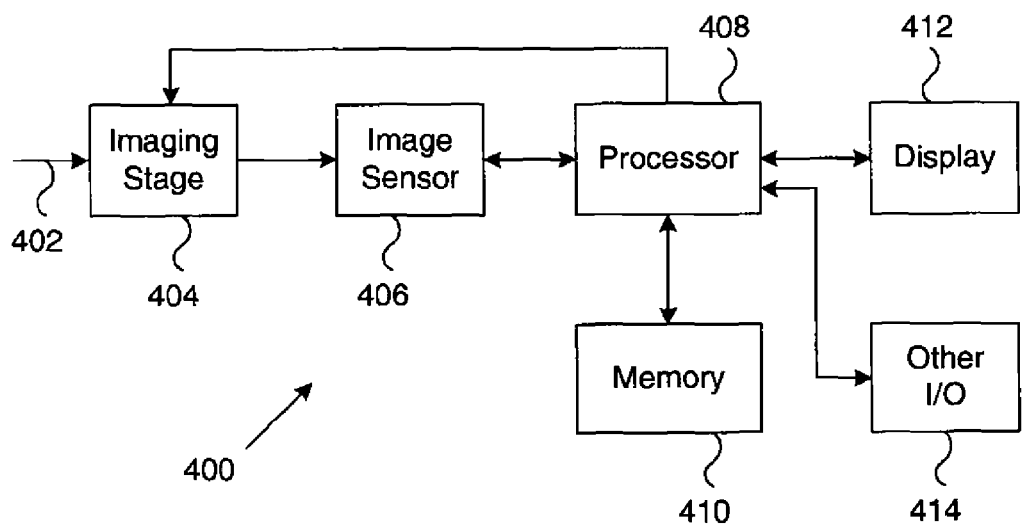
FIG. 4

BACK-ILLUMINATED CMOS IMAGE SENSORS

TECHNICAL FIELD

The present invention relates generally to image sensors for use in digital cameras and other types of image capture devices, and more particularly to back-illuminated image sensors.

BACKGROUND

An electronic image sensor captures images using light-sensitive photodetectors that convert incident light into electrical signals. Image sensors are generally classified as either front-illuminated image sensors or back-illuminated image sensors. FIG. 1 is a simplified illustration of a front-illuminated image sensor in accordance with the prior art. Image sensor 100 includes pixels 102, 104, 106 formed within a sensor layer 108 and a circuit layer 110. Photodetectors 112, 114, 116 are formed in sensor layer 108. Conductive interconnects 118, 120, 122, such as gates and connectors, are formed in circuit layer 110.

Unfortunately, the positioning of conductive interconnects 118, 120, 122, and various other features associated with circuit layer 110, over photodetectors 112, 114, 116 adversely impacts the fill factor and quantum efficiency of image sensor 100. This is because light 124 from a subject scene must pass through circuit layer 110 before it is detected by photodetectors 112, 114, 116.

A back-illuminated image sensor addresses the fill factor and quantum efficiency issues by constructing the image sensor such that the light from a subject scene is incident on a backside of a sensor layer. The "frontside" 126 of sensor layer 108 is conventionally known as the side of sensor layer 108 that abuts circuit layer 110, while the "backside" 128 is the side of sensor layer 108 that opposes frontside 126. FIG. 2 is a simplified illustration of a back-illuminated image sensor in accordance with the prior art. Circuit layer 110 is positioned between support substrate 202 and sensor layer 108. This allows light 124 to strike the backside 128 of sensor layer 108, where it is detected by photodetectors 112, 114, 116. The detection of light 124 by photodetectors 112, 114, 116 is no longer impacted by the metallization level interconnects and other features of circuit layer 110.

Back-illuminated image sensors, however, can present a new set of challenges. Interface 204 between sensor layer 108 and insulating layer 206 can produce high levels of dark current and a loss of quantum efficiency, especially in the blue light spectrum. This is due to the presence of dangling bonds at the etched silicon surface of backside 128. Moreover, conventional passivation techniques for passivating interface 204 can be adversely impacted by subsequent processing steps during fabrication of image sensor 200.

FIG. 3 depicts an exemplary doping profile of interface 204 along line A-A' in FIG. 2. Conventional back-illuminated image sensors are constructed as n-type metal-oxide-semiconductor (NMOS) image sensor. Thus, the n-doped photodetectors are formed in a well or layer doped with one or more p-type dopants. Line 300 depicts a doping profile of boron dopants (p-type) at interface 204 prior to the performance of subsequent Complementary Metal Oxide Semiconductor (CMOS) fabrication steps on image sensor 200, while line 302 illustrates the doping profile of boron at interface 204 after the performance of the subsequent CMOS fabrication steps. As shown in FIG. 3, the boron dopants diffuse out of sensor layer 108 and into insulating layer 206 during the subsequent CMOS fabrication steps. This diffusion creates a drop in doping profile 304 on the sensor layer side of interface 204. The drop in the doping profile produces an unwanted electrostatic potential well that traps photo-induced charge carriers at interface 204. Substituting slower diffusing p-type dopants, such as indium, for boron can reduce the thermal diffusion during processing, but indium increases the number of dark field bright point defects in the image sensor.

Accordingly, a need exists for improved processing techniques for forming back-illuminated image sensors.

SUMMARY

Briefly summarized, according to one aspect of the invention, a back-illuminated image sensor includes a sensor layer disposed between an insulating layer and a circuit layer electrically connected to the sensor layer. An imaging area that includes a plurality of pixels is formed in the sensor layer, with each pixel having a photodetector doped with one or more p-type dopants. In one embodiment in accordance with the invention, a well doped with one or more n-type dopants spans the imaging area and is disposed between the photodetectors and the backside of the sensor layer. In another embodiment in accordance with the invention, the well is a buried well and a p-type doped region is created between the photodetector and the buried well. One or more additional side wells doped with an n-type dopant can be formed laterally adjacent to each photodetector.

The n-type dopant or dopants in the well or buried well have a segregation coefficient that causes the n-type dopant to accumulate in the sensor layer side of an interface between the backside of the sensor layer and the insulating layer. This accumulation of the n-type dopant or dopants passivates the interface between the sensor layer and the insulating layer and prevents the formation of an electrostatic potential well at the interface. Additionally, the well or buried well can be biased at a predetermined potential with respect to ground for driving the photo-generated charges into the nearest respective photodetector in the sensor layer. The well or buried well can also include a doping gradient that steers the photo-generated charges into the nearest respective photodetector in the sensor layer. And finally, one or more active electronic components can be disposed in the sensor layer within each pixel, and electronic circuitry that is electrically connected to the imaging area can be disposed outside of the imaging area.

Advantageous Effect of the Invention

Due to segregation, n-type dopants in the well or buried well accumulate in the sensor layer side of an interface between the backside of the sensor layer and the insulating layer while the p-type dopants diminish in the sensor layer side of the interface. The combination of the increased concentration of the n-type dopant and the decreased concentration of the p-type dopant at the interface prevents the formation of a potential well in the sensor layer side of the interface. Doping of the well or buried well can occur after thermal oxidation of the shallow trench isolation regions. This minimizes the thermal diffusion of the dopants in the well or buried well. Additionally, any photo-generated charge that is trapped at the interface between the sensor layer and the insulating layer during the fabrication process is typically positive in a PMOS image sensor. Positive charge directs the photo-generated charges toward the photodetectors and favorably passivates the interface.

BRIEF DESCRIPTION OF THE DRAWINGS

The above and other objects, features and advantages of the invention will become more apparent by reference to the following detailed description of the invention taken in conjunction with the accompanying drawings, wherein:

FIG. 1 is a simplified cross-sectional illustration of a frontside illuminated image sensor according to the prior art;

FIG. 2 is a simplified cross-sectional illustration of a back-illuminated image sensor according to the prior art;

FIG. 3 depicts an exemplary doping profile of interface 204 along line A-A' in FIG. 2;

FIG. 4 is a simplified block diagram of an image capture device in an embodiment in accordance with the invention;

DETAILED DESCRIPTION

Figure 5:
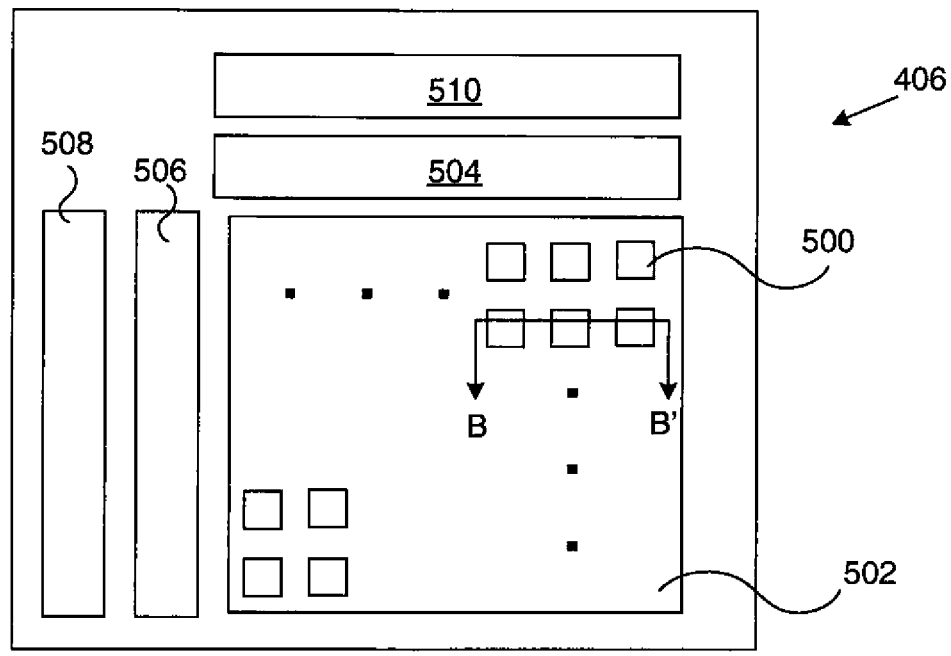
FIG. 5 is a simplified block diagram of image sensor 406 shown in FIG. 4 in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal. Referring to the drawings, like numbers indicate like parts throughout the views.

Additionally, the terms such as "on" or "over", when used in conjunction with layers of an image sensor wafer or corresponding image sensor, are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Referring now to FIG. 4, there is shown an image capture device in an embodiment in accordance with the invention. Image capture device 400 is implemented as a digital camera in FIG. 4. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 400, light 402 from a subject scene is input to an imaging stage 404. Imaging stage 404 can include conventional elements such as a lens, a neutral density filter, an iris and a shutter. Light 402 is focused by imaging stage 404 to form an image on image sensor 406. Image sensor 406 captures one or more images by converting the incident light into electrical signals. Digital camera 400 further includes processor 408, memory 410, display 412, and one or more additional input/output (I/O) elements 414. Although shown as separate elements in the embodiment of FIG. 4, imaging stage 404 may be integrated with image sensor 406, and possibly one or more additional elements of digital camera 400, to form a compact camera module.

Processor 408 may be implemented, for example, as a microprocessor, a central processing unit (CPU), an application-specific integrated circuit (ASIC), a digital signal processor (DSP), or other processing device, or combinations of multiple such devices. Various elements of imaging stage 404 and image sensor 406 may be controlled by timing signals or other signals supplied from processor 408.

Memory 410 may be configured as any type of memory, such as, for example, random access memory (RAM), read-only memory (ROM), Flash memory, disk-based memory, removable memory, or other types of storage elements, in any combination. A given image captured by image sensor 406 may be stored by processor 408 in memory 410 and presented on display 412. Display 412 is typically an active matrix color liquid crystal display (LCD), although other types of displays may be used. The additional I/O elements 414 may include, for example, various on-screen controls, buttons or other user interfaces, network interfaces, or memory card interfaces.

It is to be appreciated that the digital camera shown in FIG. 4 may comprise additional or alternative elements of a type known to those skilled in the art. Elements not specifically shown or described herein may be selected from those known in the art. As noted previously, the present invention may be implemented in a wide variety of image capture devices. Also, as mentioned above, certain aspects of the embodiments described herein may be implemented at least in part in the form of software executed by one or more processing elements of an image capture device. Such software can be implemented in a straightforward manner given the teachings provided herein, as will be appreciated by those skilled in the art.

FIG. 5 is a simplified block diagram of image sensor 406 shown in FIG. 4 in an embodiment in accordance with the invention. Image sensor 406 typically includes an array of pixels 500 that form an imaging area 502. Image sensor 406 further includes column decoder 504, row decoder 506, digital logic 508, and analog or digital output circuits 510. Image sensor 406 is implemented as a back-illuminated Complementary Metal Oxide Semiconductor (CMOS) image sensor in an embodiment in accordance with the invention. Thus, column decoder 504, row decoder 506, digital logic 508, and analog or digital output circuits 510 are implemented as standard CMOS electronic circuits that are electrically connected to imaging area 502.

Functionality associated with the sampling and readout of imaging area 502 and the processing of corresponding image data may be implemented at least in part in the form of software that is stored in memory 410 and executed by processor 408 (see FIG. 4). Portions of the sampling and readout circuitry may be arranged external to image sensor 406, or formed integrally with imaging area 502, for example, on a common integrated circuit with photodetectors and other elements of the imaging area. Those skilled in the art will recognize that other peripheral circuitry configurations or architectures can be implemented in other embodiments in accordance with the invention.

Figure 6A:
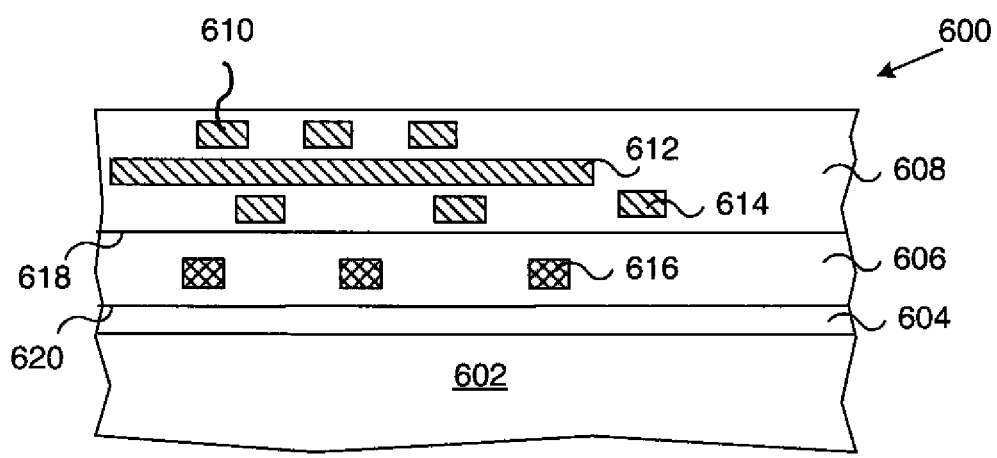
FIGS. 6(A)-6(C) are simplified cross-sectional views of a portion of an image sensor that are used to illustrate a method of fabricating a back-illuminated image sensor in an embodiment in accordance with the invention.
Figure 6B:
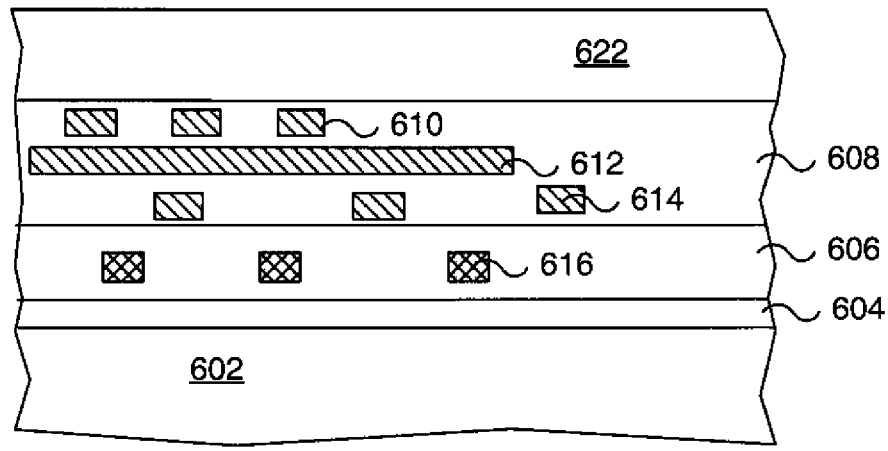
Figure 6C:
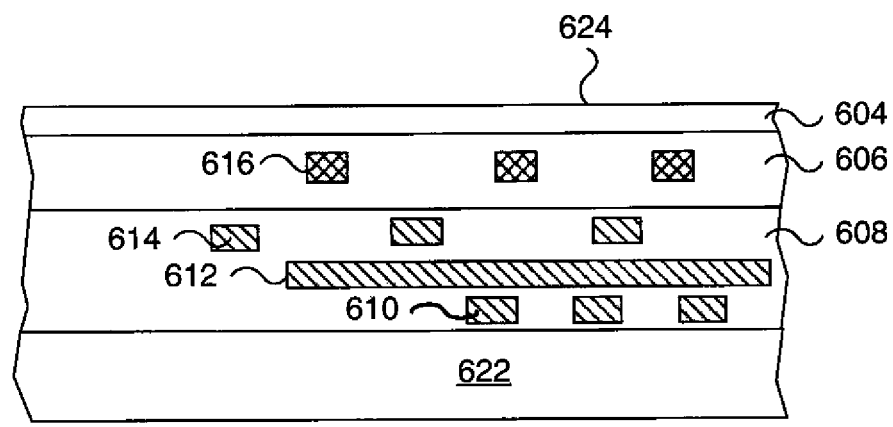

Referring now to FIGS. 6(A)-6(C), there are shown simplified cross-sectional views of a portion of an image sensor that are used to illustrate a method of fabricating a back-illuminated image sensor in an embodiment in accordance with the invention. FIG. 6 shows a portion of an image sensor wafer 600 at the completion of a number of initial steps of an exemplary CMOS fabrication process. Image sensor wafer 600 at this stage includes substrate 602, insulating layer 604 formed over substrate 602, sensor layer 606 formed over insulating layer 604, and circuit layer 608 formed over sensor layer 606. Various image sensor features, such as conductive interconnects 610, 612, gates 614, or other circuit elements can be formed within circuit layer 608 using conventional techniques.

Sensor layer 606 is processed to form photodetectors 616 and other circuit elements within sensor layer 606. Sensor layer 606 has a frontside 618 and a backside 620. As described previously herein, the "frontside" 618 of sensor layer 606 is conventionally known as the side of sensor layer 606 that is adjacent to circuit layer 608, while the "backside" 620 is the side of sensor layer 606 that opposes frontside 618. Substrate 602 and sensor layer 606 are typically formed with a silicon material, insulating layer 604 with a silicon dioxide material, and circuit layer 608 with a dielectric material in an embodiment in accordance with the invention. Interconnects 610, 612 and gates 614 in circuit layer 608 are associated with various metallization levels.

Image sensor wafer 600 depicted in FIG. 6(A) is an example of a silicon-on-insulator (SOI) wafer. In such a wafer, the thickness of the sensor layer 606 maybe approximately 1 to 50 micrometers, and the thickness of insulating layer 604 may be approximately 0.1 to 3 micrometers, although other thicknesses may be used. Substrate 602 is typically substantially thicker than sensor layer 606 or insulating layer 604, and may be approximately 300 to 1000 micrometers in thickness. Other embodiments in accordance with the invention may use other types of wafers to form back-illuminated image sensors, such as, for example, epitaxial wafers or bulk semiconductor wafers that do not include an insulating layer 604.

FIG. 6(B) illustrates image sensor wafer 600 after support wafer 622 is bonded to circuit layer 608. Support wafer 622 is typically bonded to circuit layer 608 with one or more adhesive layers (not shown), or bonded directly with the application of pressure or temperature One example of a material that can be used for direct bonding is silicon dioxide.

Substrate 602 is then removed, resulting in the image sensor wafer structure as shown in FIG. 6(C). Substrate 602 may be removed using, for example, grinding, polishing or etching techniques, in any combination. Substrate 602 is removed in its entirety with insulating layer 604 acting as an etch stop in an embodiment in accordance with the invention. In other embodiments in accordance with the invention, such as one involving an epitaxial or bulk semiconductor wafer, substrate 602 can be thinned rather than removed completely, and an insulating layer deposited onto the etched surface.

After removal of substrate 602, the structure is flipped over (as shown) and processed further. Subsequent processing steps may include the formation of a color filter array and associated microlenses on the backside 624 of insulating layer 604 (see FIG. 7).

Figure 7:
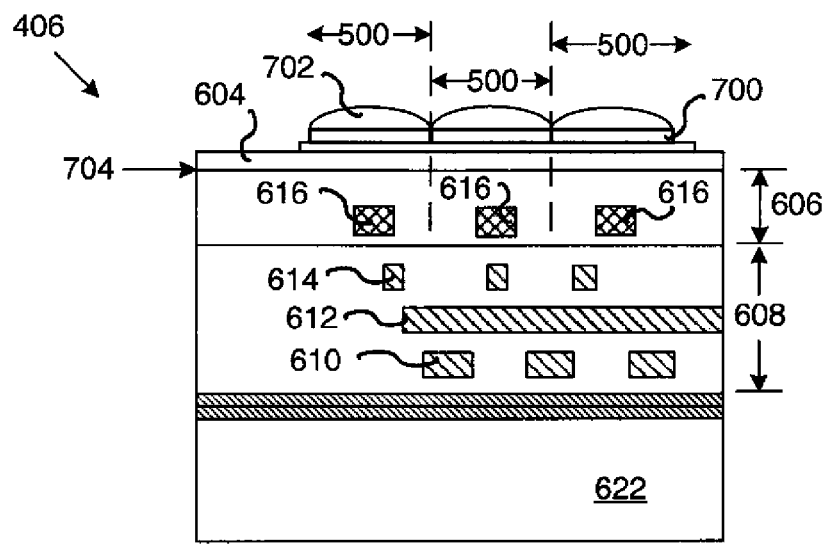
FIG. 7 is a cross-sectional view along line B-B' in FIG. 5 of a portion of image sensor 406 in an embodiment in accordance with the invention.

Referring now to FIG. 7, there is shown a cross-sectional view along line B-B' in FIG. 5 of a portion of image sensor 406 in an embodiment in accordance with the invention. Image sensor 406 includes pixels 500 formed within a sensor layer 606 and a circuit layer 608. Photodetectors 616 are formed in sensor layer 606. Conductive interconnects 610, 612, 614, such as gates and connectors, are formed in circuit layer 608.

Color filter elements 700 are shown formed on insulating layer 604. Also associated with each color filter element 700 is a corresponding microlens 702. Color filter elements 700 are arranged over respective photodetectors 616 and typically act as bandpass filters that allow each photodetector 616 to detect light propagating at particular wavelength ranges. For example, one color filter element permits light propagating in the wavelength range corresponding to red light to be detected by a photodetector while an adjacent color filter element allows light propagating in the wavelength range corresponding to green light to be detected by a photodetector.

As will be described herein in conjunction with FIGS. 8 and 12-16, sensor layer 606 is formed in a manner that passivates interface 704 between sensor layer 606 and insulating layer 604 to reduce dark current and improve quantum efficiency. Moreover, sensor layer 606 is biased to a known potential with respect to ground to steer photo-generated charges, especially those charges generated near the back side surface of the back-illuminated image sensor, into the nearest photodetector. And finally, sensor layer 606 can include a dopant gradient that steers the photo-generated charges into the nearest photodetector. Steering the photo-generated charges into the nearest photodetector minimizes crosstalk and lag within the image sensor.

Figure 8:
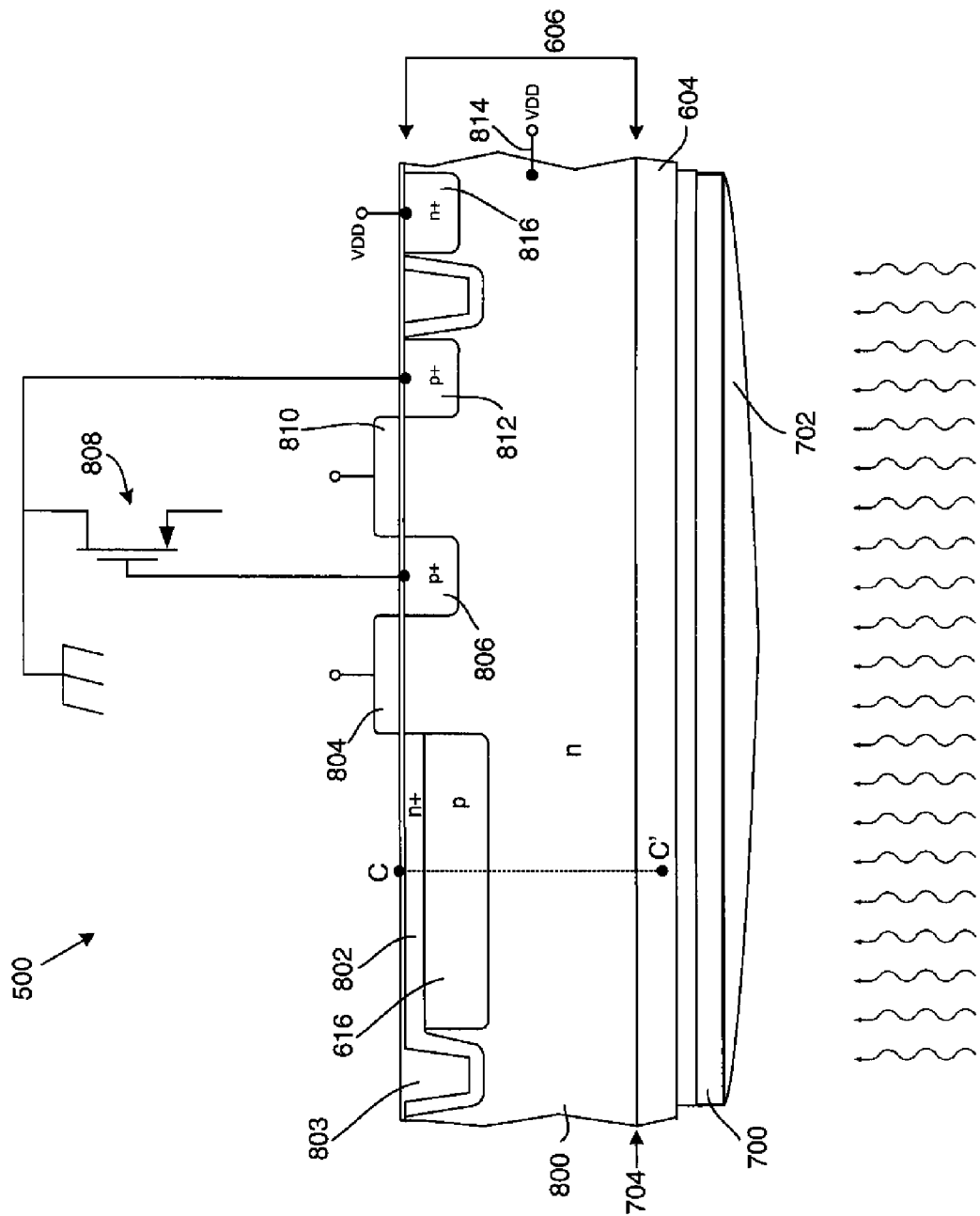
FIG. 8 is a cross-sectional view of a first pixel structure in an embodiment in accordance with the invention.

FIG. 8 is a cross-sectional view of a first pixel structure in an embodiment in accordance with the invention. Pixel 500 includes photodetector 616 formed within well 800. Photodetector 616 is implemented as a photodiode in the embodiment of FIG. 8. Pinning layer 802 is formed over photodetector 616. One or more shallow trench isolation (STI) regions 803 are formed within pixel 500.

Transfer gate 804 is used to transfer the photo-generated charges from photodetector 616 to charge-to-voltage converter 806. Charge-to-voltage converter 806 is configured as a floating diffusion in an embodiment in accordance with the invention. Converter 806 converts the charge into a voltage signal. Source-follower transistor 808 buffers the voltage signal stored in charge-to-voltage converter 806. Reset transistor 806, 810, 812 is used to reset converter 806 to a known potential prior to pixel readout.

Well 800 is biased to a known voltage level VDD through well contact 814. Biasing well 800 to a known potential with respect to ground steers the photo-generated charges into photodetector 616. Well contact 814 is positioned outside of imaging area 502 (FIG. 5) at the periphery of image sensor 406 in an embodiment in accordance with the invention. Other well contacts 816 are periodically spaced throughout imaging area 502 (FIG. 5) to reduce the effective resistance of well 800 and reduce or eliminate well bounce in the embodiment shown in FIG. 8.

Pixel 500 is based on p-type metal-oxide-semiconductor (PMOS) circuitry in an embodiment in accordance with the invention. Thus, photodetector 616 is doped with one or more p-type dopants and well 800 and pinning layer 802 are doped with one or more n-type dopants. Examples of n-type dopants include, but are not limited to, phosphorus, antimony, and arsenic. Boron and gallium are examples of p-type dopants.

Figure 9:
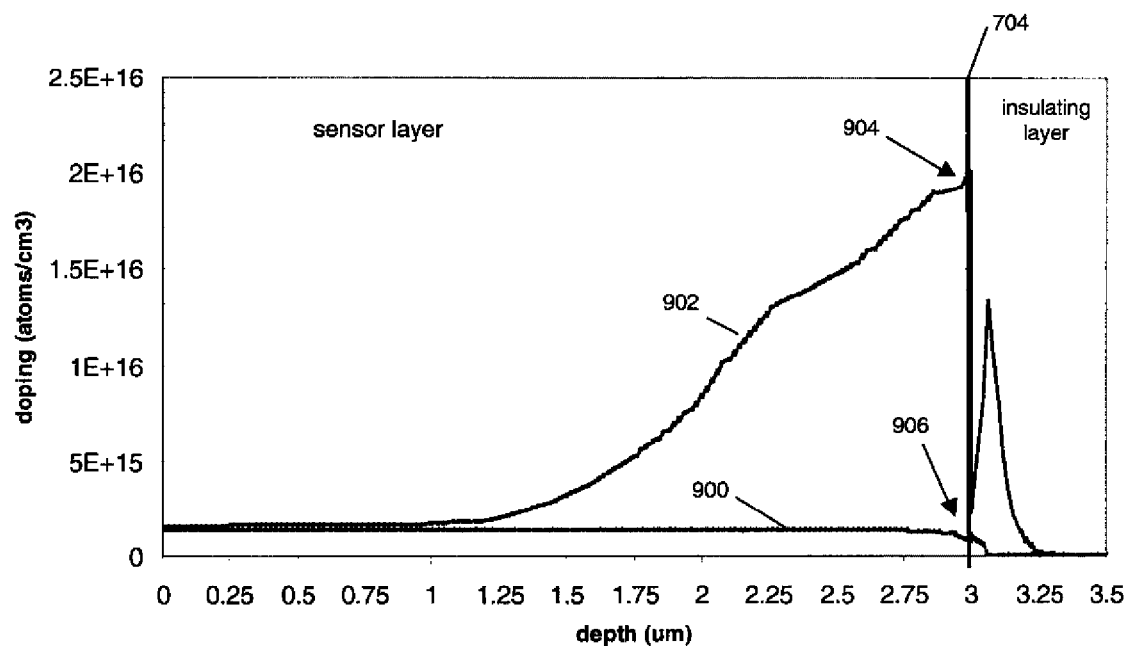
FIG. 9 depicts an exemplary doping profile of interface 704 along line C-C' in FIG. 8 in an embodiment in accordance with the invention.

FIG. 9 depicts an exemplary doping profile of interface 704 along line C-C' in FIG. 8 in an embodiment in accordance with the invention. Line 900 illustrates the doping profile of a boron doped SOI wafer after oxidation of STI regions 803, while line 902 depicts the doping profile of implanted phosphorous dopants in well 800 after oxidation of the STI regions. As shown in FIG. 9, both the boron and the phosphorous dopants diffuse during oxidation of the STI regions. Due to segregation, the phosphorus dopants accumulate on the silicon side of interface 704 (see point 904) while the boron dopants diminish on the silicon side of interface 704 (see point 906). The combination of the increased concentration of the n-type phosphorus dopants and the decreased concentration of the p-type boron dopants at interface 704 reduces or prevents the formation of a potential well on the sensor layer side of interface.

The phosphorous segregation at interface 704 further improves the performance of an image sensor because the segregation coefficients between silicon and silicon dioxide for phosphorous and boron provide for an effective build-up of net n-type dopants on the silicon side of interface 704. This enhanced net n-type doping concentration in the silicon at interface 704 creates a potential gradient that directs photo-generated charges (i.e., holes) into the photodetector. Although the electric field gradient may be small, an electrostatic potential well like prior art well 304 (see FIG. 3) is not created at the surface. Also, during subsequent CMOS fabrication steps, positive charge can be trapped at interface 704, which further directs the photo-generated charge towards the photodetector.

The effective n-dopant build-up on the sensor layer side of interface 704 also improves dark current performance for a PMOS image sensor. According to the theory of Shockley-Read-Hall, the generation rate for a single type of trap is $$U = \sigma v_{th} N_t^* (n_i^2 - np)/(n + p + 2n_i \cos h((E_t - E_i)/kT)), \quad (1)$$

where U is the generation rate, $\sigma$ the trap's capture cross-section, $v_{th}$ the thermal velocity, $N_t$ the trap density, n the local electron concentration, p the local hole concentration, $n_i$ the intrinsic carrier concentration, $E_t$ the trap energy, and $E_i$ the intrinsic Fermi energy. Unterminated silicon bonds are nearly mid-gap (Et=Ei) so U effectively reduces to $\sigma v_{th} N_t^* n_i 2/(n+p+2n_i)$, where the np term is taken as zero. At room temperature $n_i$ is 1.6E10 cm-3. Therefore an electron concentration of 2E16 cm-3 at interface 704 will suppress the dark current generation from dangling silicon bonds by almost six orders of magnitude, effectively passivating interface 704. This is unlike the NMOS image sensor shown in FIG. 2, where the effective n-dopant build-up on the silicon side of interface 204 produces a well in the boron concentration (see point 304 in FIG. 3).

In another embodiment in accordance with the invention, the dopants in well 800 can be doped such that an enhanced dopant gradient is formed in well 800. The dopant gradient is formed, for example, by performing a chain of implants that result in a greater number of n-type dopants at interface 704. This dopant gradient provides a more uniform electric field in well 800 so that photo-generated charges are driven more effectively into photodetector 616.

Figure 10:
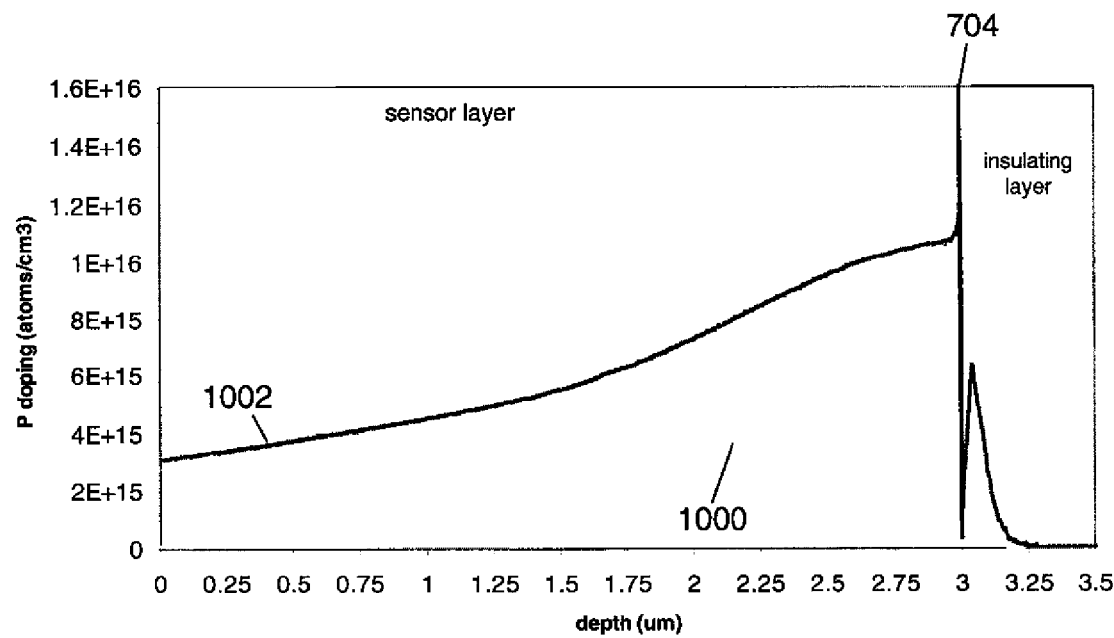
FIG. 10 is an illustration of an alternate exemplary doping profile of interface 704 along line C-C' in FIG. 8 in an embodiment in accordance with the invention.

FIG. 10 depicts an alternate exemplary doping profile of interface 704 along line C-C' in FIG. 8 when a chain of three phosphorous implants are implanted into well 800. Line 1000 depicts the phosphorous dopants after a deep well implant and before thermal oxidation of STI regions 803 (FIG. 8). Line 1002 illustrates the phosphorous dopants after thermal oxidation of the STI regions. The STI oxidation thermally diffuses the n-type dopants in well 800 and removes the peaks and valleys in doping profile 1 000. Removing the peaks and valleys reduces potential wells in the electrostatic profile between interface 704 and photodetector 616. Moreover, when the n-type dopant in well 800 is phosphorous, the phosphorous segregation at interface 704 improves lag and dark current performance as described earlier. It is worth noting again that the high energy implant doses required to define an n-type well 800 are much lower than the doses required to define a p-type well for a corresponding NMOS pixel with comparable lag and dark current performance.

Figure 11:
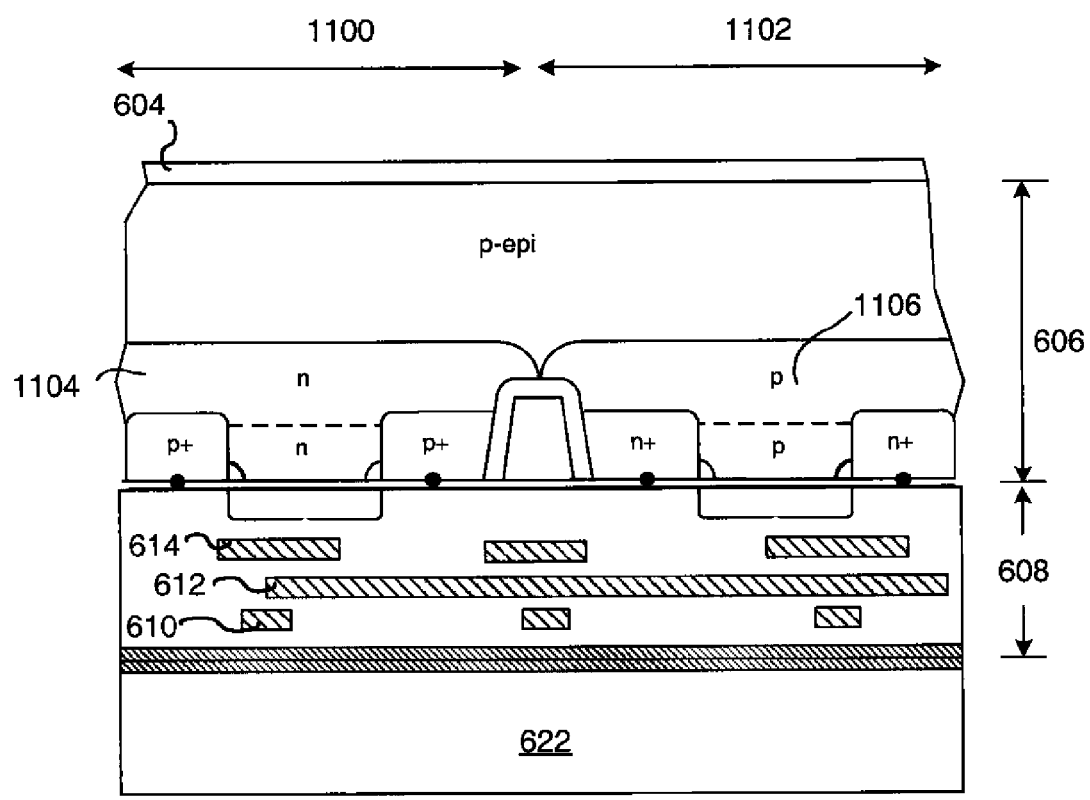
FIG. 11 is a cross-sectional view of a portion of the standard CMOS circuitry in an embodiment in accordance with the invention.

Referring now to FIG. 11, there is shown a cross-sectional view of a portion of the standard CMOS circuitry in an embodiment in accordance with the invention. The standard PMOS 1100 and NMOS 1102 transistors, and their associated shallow n-well 1104 and p-well 1106 implants are unaffected by the deep well implant 800 (FIG. 8) in the imaging area 502 (FIG. 5). The p-type 1100 and n-type 1102 transistors in the CMOS circuitry outside of imaging area 502 are fabricated using the standard CMOS process flow. During fabrication of the color filter array, the CMOS circuitry is protected from back illumination by an opaque lightshield (not shown) in an embodiment in accordance with the invention. The lightshield can be metal, a stacked layer of red, green, and blue color filter array material, or a unique light absorbing material.

Figure 12:
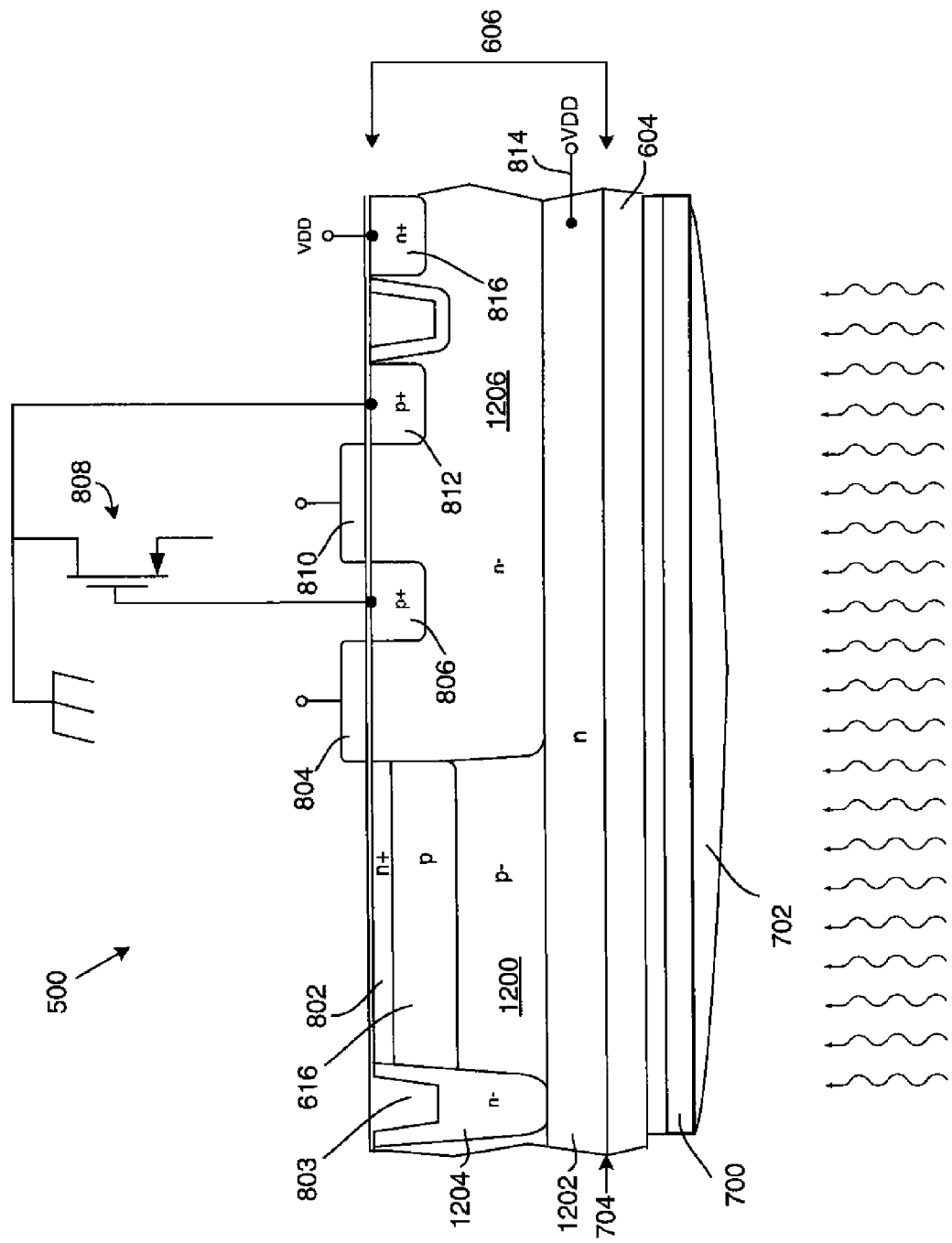
FIG. 12 is a cross-sectional view of an alternate pixel structure in an embodiment in accordance with the invention.

FIG. 12 is a cross-sectional view of an alternate pixel structure in an embodiment in accordance with the invention. Pixel 500 includes a number of the same elements shown in FIG. 8, and like reference numerals have been used to indicate such elements. Pixel 500 increases a depletion depth of photodetector 616 with region 1200 by effectively producing an "extension" of photodetector 616. Region 1200 is lightly doped with one or more p-type dopants in an embodiment in accordance with the invention.

Buried well 1202 and side wells 1204, 1206 are doped with an n-type dopant and are formed such that p-region 1200 is created between photodetector 616, buried well 1202, and side wells 1204, 1206. Side n-wells 1204, 1206 steer the photo-generated charges into photodetector 616 and electrically connect well contact 816 to buried well 1202. In other embodiments in accordance with the invention, side wells 1204, 1206 do not abut and make direct contact with buried well 1202. U.S. patent application Ser. No. 12/054,505, filed on Mar. 25, 2008 and entitled "A Pixel Structure With A Photodetector Having An Extended Depletion Depth," incorporated by reference herein, describes in more detail the pixel structure of FIG. 12 and an alternate pixel structure where side wells 1204, 1206 do not abut buried well 1202.

Figure 13A:
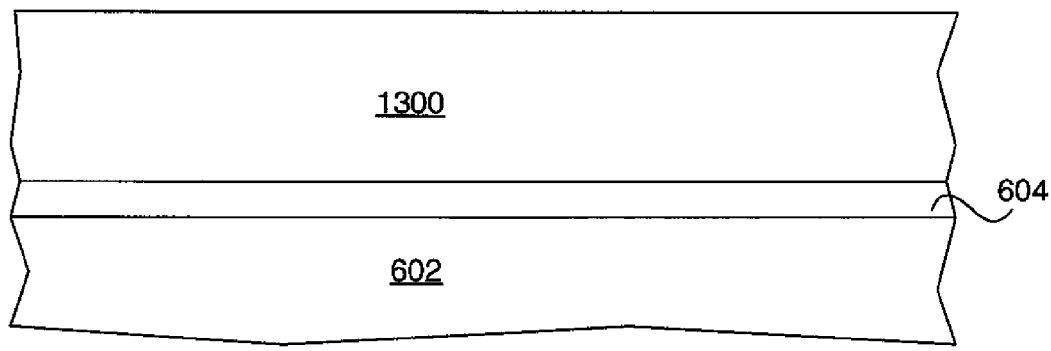
FIGS. 13(A)-13(E) are cross-sectional views of a portion of a pixel that are used to illustrate a method of fabricating photodetector 616, buried well 1202, and side wells 1204, 1206 shown in FIG. 12 in an embodiment in accordance with the invention.

FIGS. 13(A)-13(E) are cross-sectional views of a portion of a pixel that are used to illustrate a method of fabricating photodetector 616, buried well 1202, and side wells 1204, 1206 shown in FIG. 12 in an embodiment in accordance with the invention. Only those fabrication steps necessary to understanding the present invention are shown in FIG. 13. Initially, as shown in FIG. 13(A), epitaxial layer 1300 is formed on insulating layer 604 (FIG. 6) using a known fabrication technique. Epitaxial layer 1300 and substrate 602 (FIG. 6) are doped with a p-type dopant in an embodiment in accordance with the invention.

Figure 13B:
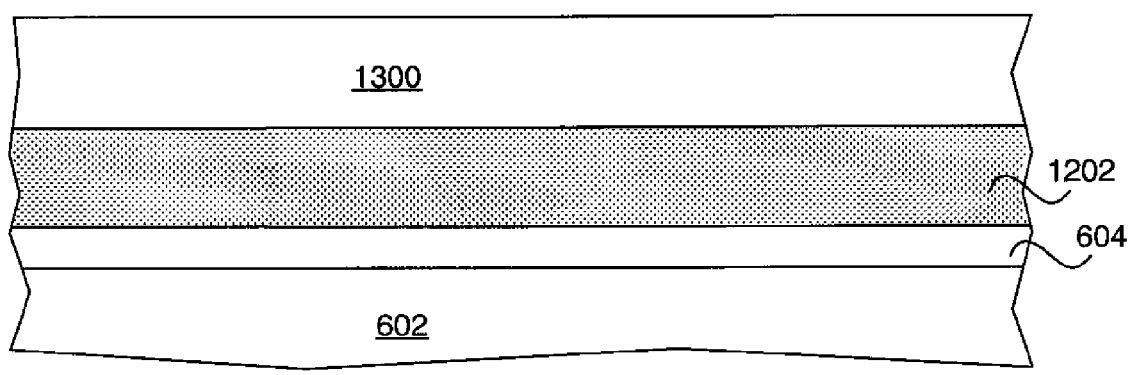

Next, as shown in FIG. 13(B), a portion of epitaxial layer 1300 is doped with one or more n-type dopants (doping represented by arrows 1302) to form buried well 1202 (FIG. 12). Buried well 1202 is formed by implanting one or more n-type dopants into epitaxial layer 1300 in the embodiment shown in FIG. 13(B). Buried well 1202 is disposed in only a portion of epitaxial layer 1300, and a portion of the remaining epitaxial layer 1300 will be used to form p-region 1200 (FIG. 12).

Figure 13C:
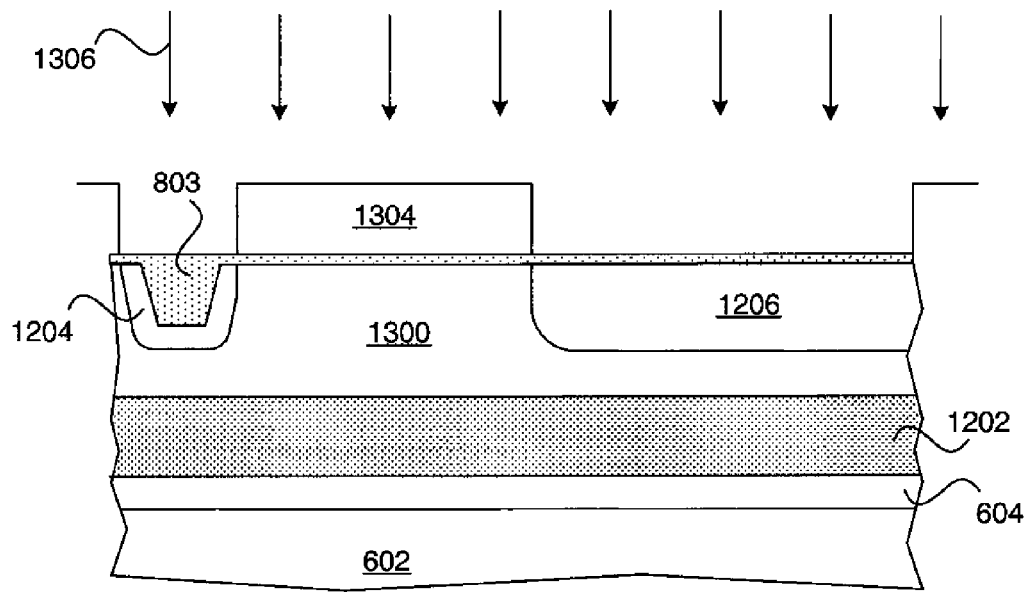

Next, as shown in FIG. 13(C), mask 1304 is deposited and patterned over the pixel. Side wells 1204, 1206 (FIG. 12) are then formed in portions of epitaxial layer 1300 by implanting one or more n-type dopants into epitaxial layer 1300 (doping represented by arrows 1306 in FIG. 13(C)). Those skilled in the art will appreciate that shallow trench isolation (STI) 803 is formed in epitaxial layer 1300 and filled with a dielectric material prior to the formation of side wells 1204, 1206 (formation of STI 803 is optional and not part of the present invention). In the embodiment shown in FIG. 13(C), side wells 1204, 1206 do not abut buried well 1202. In another embodiment in accordance with the invention, side wells 1204, 1206 abut and make direct contact with buried well 1202 (as shown in the embodiment of FIG. 12).

Figure 13D:
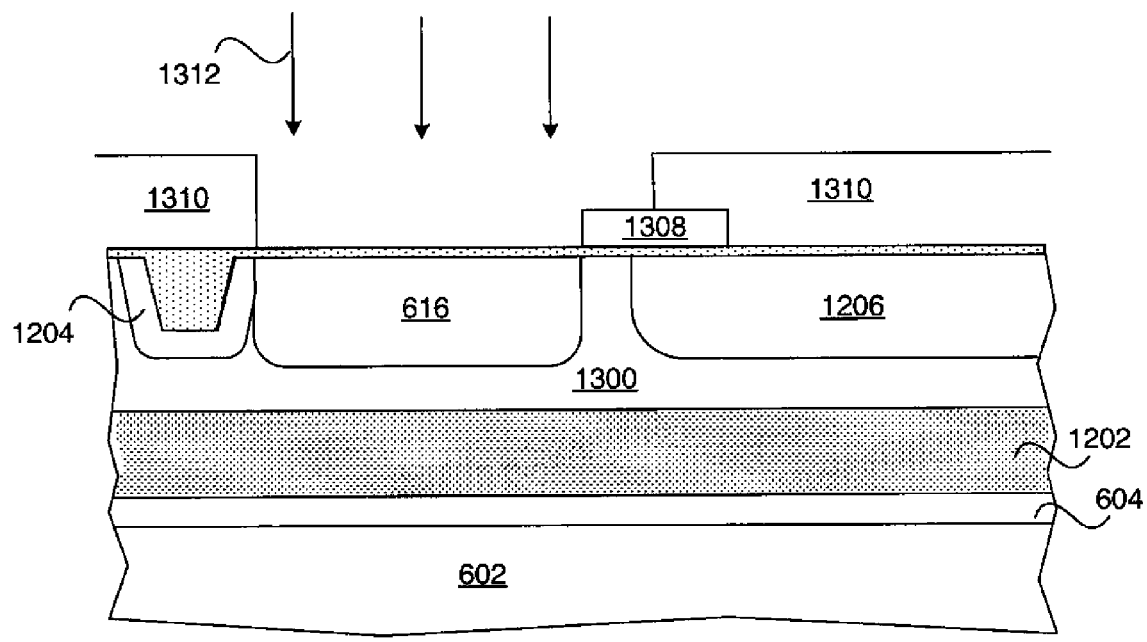

Mask 1304 is then removed and transfer gate 1308 formed on the surface of the pixel, as shown in FIG. 13(D). Mask 1310 is deposited and patterned over the pixel and photodetector 616 is formed in a portion of epitaxial layer 1300 by doping a portion of epitaxial layer 1300 with one or more p-type dopants (doping represented by arrows 1312). The p-type dopant or dopants that are implanted into photodetector 616 are self-aligned to transfer gate 1308, thereby improving lag performance of the pixel.

Figure 13E:
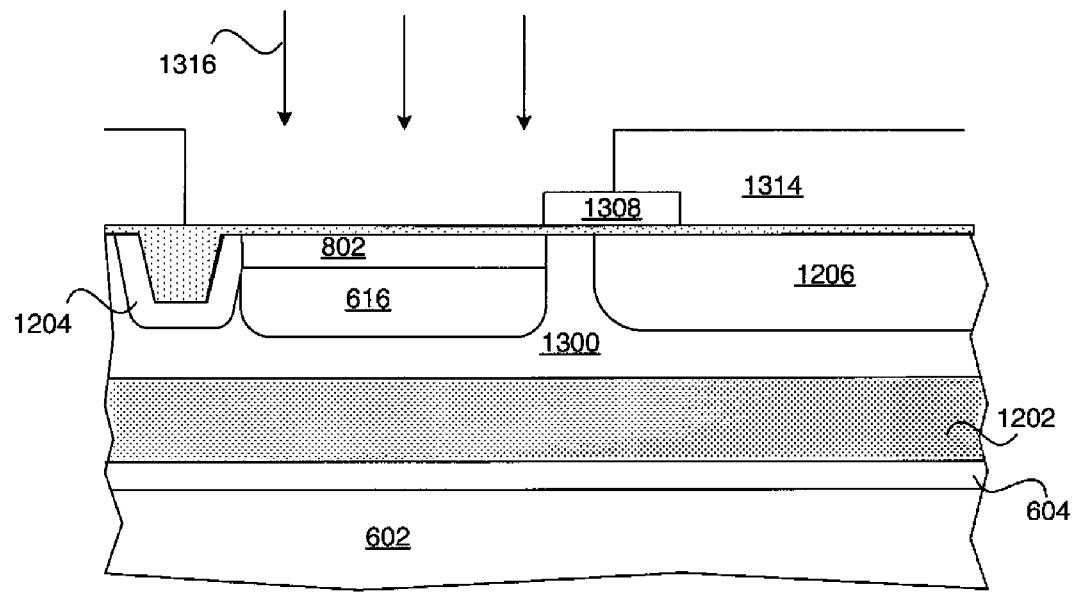

Next, as shown in FIG. 13(E), mask 1310 is removed and another mask 1314 deposited and patterned on the surface of the pixel. Pinning layer 802 (FIG. 8) is then formed over photodetector 616 by doping a portion of photodetector 616 with one or more n-type dopants (doping represented by arrows 1316). Although FIG. 13(E) depicts side well 1206 as not abutting photodetector 616 and pinning layer 802, those skilled in the art will appreciate that side well 1206 can be formed to abut and make direct contact with photodetector 616.

Figure 14:
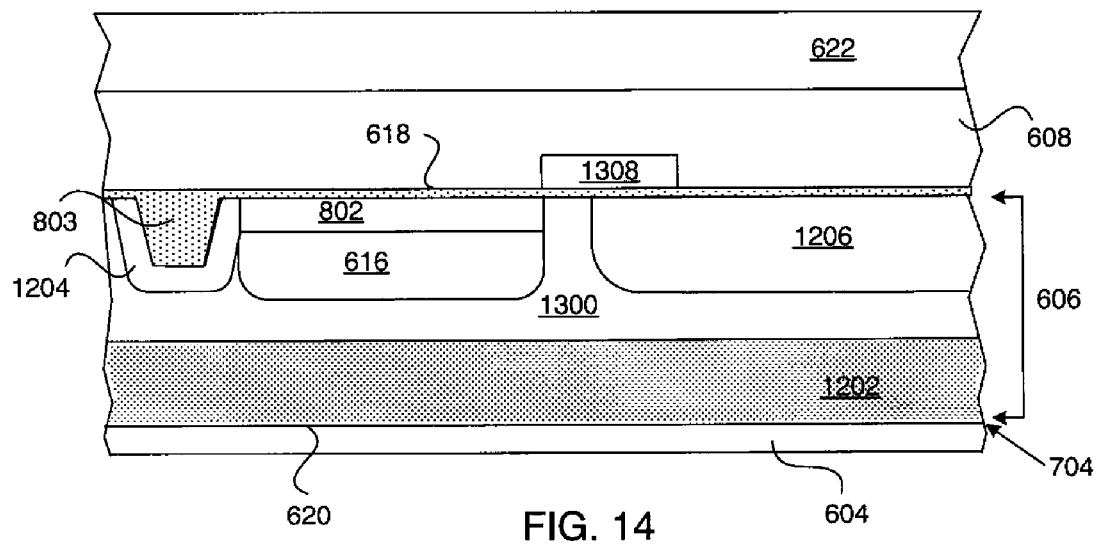
FIG. 14 is a cross-sectional view of a portion of pixel that is used to illustrate the pixel at the point of the fabrication process shown in FIG. 6(C) in an embodiment in accordance with the invention.

Referring now to FIG. 14, there is shown a cross-sectional view of a portion of pixel that is used to illustrate the pixel at the point of the fabrication process shown in FIG. 6(C) in an embodiment in accordance with the invention. A pixel in sensor layer 606 (see FIG. 6) includes side wells 1204, 1206, photodetector 616, and buried well 1202 formed in epitaxial layer 1300. Pinning layer 802 is formed over photodetector 616. And finally, one or more STI regions 803 are formed in sensor layer 606 in an embodiment in accordance with the invention.

The backside 620 of sensor layer 606 is adjacent to insulating layer 604 and the frontside 618 of sensor layer 606 is adjacent to circuit layer 608 (FIG. 6). Circuit layer 608 includes transfer gate 1308 and other features and conductive interconnects (not shown). Support substrate 622 is bonded to circuit layer 608. As described earlier, interface 704 between insulating layer 604 and sensor layer 606 is passivated by the accumulation of the n-type dopant or dopants in the sensor layer side of interface 704. This passivation reduces or prevents the formation of potential wells in the sensor layer side of interface 704.

Figure 15A:
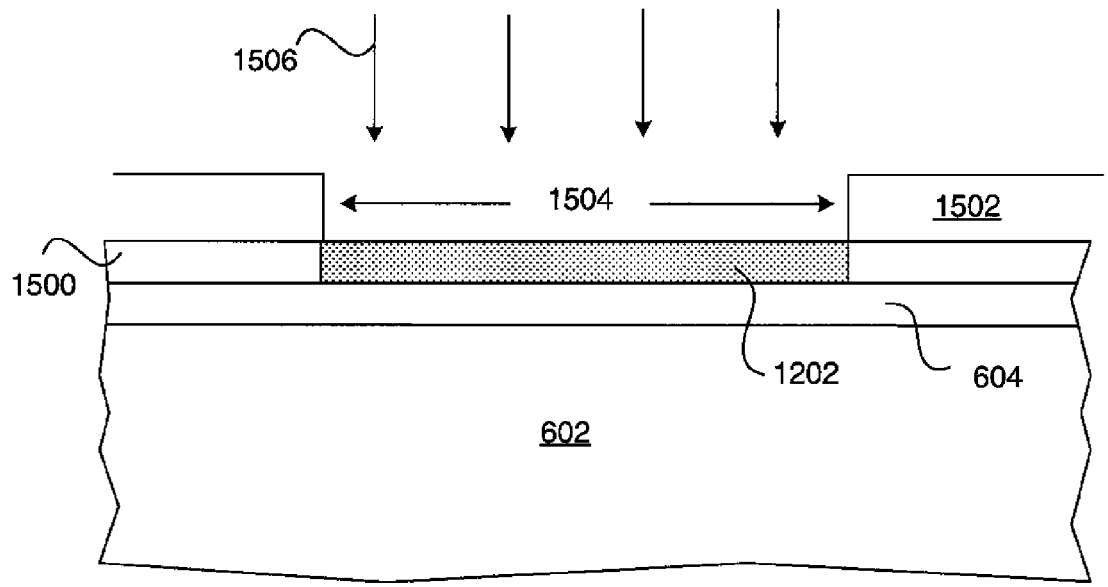
FIGS. 15(A)-15(B) are cross-sectional views of a portion of a pixel that are used to illustrate a first alternate method to fabricating buried well 1202 that can be performed instead of the step shown in FIG. 13(B) in an embodiment in accordance with the invention.
Figure 15B:
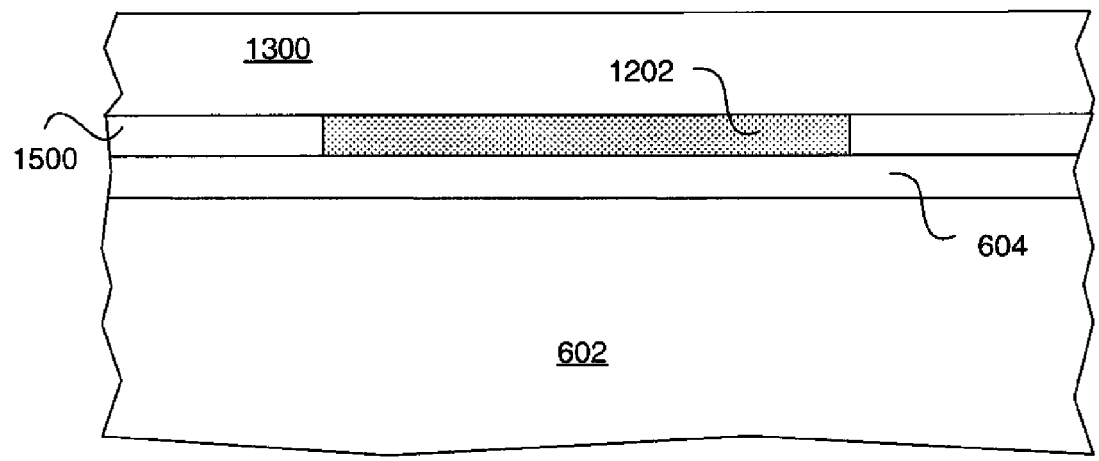

FIGS. 15(A)-15(B) are cross-sectional views of a portion of a pixel that are used to illustrate a first alternate method to fabricating buried well 1202 that can be performed instead of the step shown in FIG. 13(B) in an embodiment in accordance with the invention. The combined thickness of insulating layer 604 and substrate 602 is between twenty to ten thousand angstroms in an embodiment in accordance with the invention. Initially, layer 1500, known as a seed layer, is formed on the surface of insulating layer 604 (FIG. 6) using a known fabrication technique (see FIG. 15(A)).

Mask 1502 is then deposited over layer 1500 and patterned to form opening 1504. A portion of layer 1500 is doped with one or more n-type dopants (doping represented by arrows 1506) to form buried well 1202 (FIG. 12). An n-type dopant, such as phosphorus, arsenic, or antimony, is implanted into layer 1500 in an embodiment in accordance with the invention.

Next, as shown in FIG. 15(B), mask 1502 is removed and epitaxial layer 1300 grown on layer 1500. Epitaxial layer 1300 is an intrinsic layer or a lightly p-doped layer in an embodiment in accordance with the invention. The structure shown in FIG. 15(B) is then processed pursuant to the steps shown in FIGS. 13(C)-13(E).

Figure 16A:
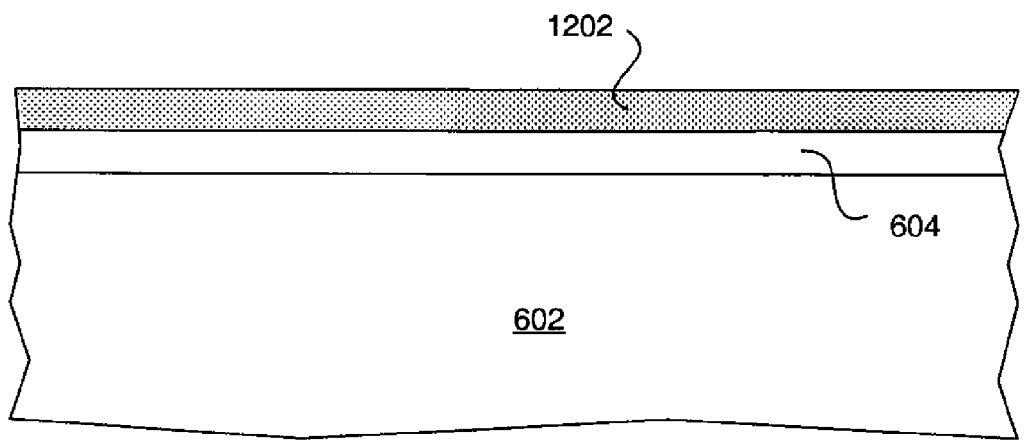
FIGS. 16(A)-16(B) are cross-sectional views of a portion of a pixel that are used to illustrate a second alternate method to fabricating buried well 1202 that can be performed instead of the step shown in FIG. 13(B) in an embodiment in accordance with the invention.
Figure 16B:
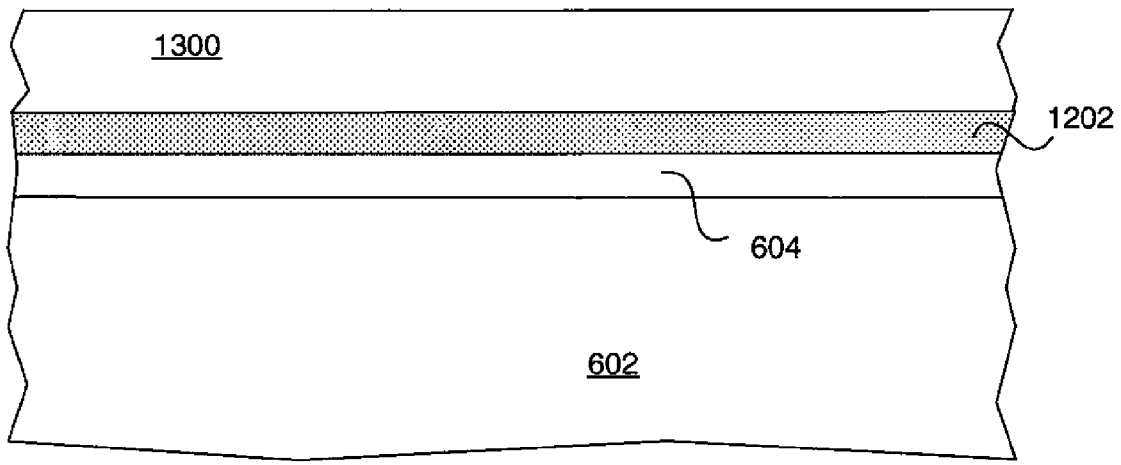

Referring now to FIGS. 16(A)-16(B), there are shown cross-sectional views of a portion of a pixel that are used to illustrate a second alternate method to fabricating buried well 1202 that can be performed instead of the step shown in FIG. 13(B) in an embodiment in accordance with the invention. Initially, a heavily n-type doped layer 1202 is formed on insulating layer 604 using a known fabrication technique (see FIG. 16(A)). Epitaxial layer 1300 is then grown on layer 1202, thereby causing layer 1202 to become a buried well. The structure shown in FIG. 16(B) is then processed pursuant to the steps shown in FIGS. 13(C)-13(E).

The invention has been described with reference to specific embodiments of the invention. However, it will be appreciated that a person of ordinary skill in the art can effect variations and modifications without departing from the scope of the invention. For example, pixel configurations can include additional, fewer, or different components than the ones shown in FIGS. 8 and 11. A bulk wafer (without epitaxial layer 1300) can be used to fabricate an image sensor.

Additionally, photodetector 616 can be implemented using alternate structures in other embodiments in accordance with the invention. Photodetector 616 can be implemented as an unpinned p-type diode formed in an n-well in a p-type epitaxial layer or substrate in another embodiment in accordance with the invention. And finally, although a simple non-shared pixel structure is shown in FIG. 8 and FIG. 11, a shared architecture can be used in other embodiments in accordance with the invention. One example of a shared architecture is disclosed in U.S. Pat. No. 6,107,655.

Parts List 100 image sensor
102 pixel
104 pixel
106 pixel
108 sensor layer 110 circuit layer
112 photodetector
114 photodetector
116 photodetector
118 interconnect
120 interconnect
122 gate
124 light
126 frontside of sensor layer
128 backside of sensor layer
200 image sensor
202 support substrate
204 interface
206 insulating layer
300 doping profile prior to subsequent CMOS fabrication steps
302 doping profile after subsequent CMOS fabrication steps
304 potential well
400 image capture device
402 light
404 imaging stage
406 image sensor
408 processor
410 memory
412 display
414 other I/O
500 pixel
502 imaging area
504 column decoder
506 row decoder
508 digital logic
510 analog or digital output circuits
600 image sensor wafer
602 substrate
604 insulating layer
606 sensor layer
608 circuit layer
610 interconnect
612 interconnect
614 gate
616 photodetector
618 frontside of sensor layer
620 backside of sensor layer
622 support wafer
700 color filter element
702 microlens
704 interface between sensor layer and insulating layer
800 well
802 pinning layer
803 shallow trench isolation (STI)
804 transfer gate
806 charge-to-voltage converter
808 source follower transistor
810 reset transistor
812 reset transistor
814 well contact
816 well contact
900 doping profile of boron doped SOI wafer
902 doping profile of phosphorus doped well
904 accumulation of phosphorus dopant
906 diminished boron dopant
1000 doping profile of phosphorus dopant
1002 doping profile of phosphorus dopant after subsequent fabrication steps
1100 PMOS transistor
1102 NMOS transistor
1104 n-well
1106 p-well
1200 p-type region
1202 buried well
1204 side well
1206 side well
1300 epitaxial layer
1302 arrows representing doping
1304 mask
1306 arrows representing doping
1308 transfer gate
1310 mask
1312 arrows representing doping
1314 mask
1316 arrows representing doping
1500 layer
1502 mask
1504 opening
1506 arrows representing doping

The invention claimed is:

1. A method for fabricating a back-illuminated image sensor that includes a sensor layer disposed between an insulating layer and a circuit layer electrically connected to the sensor layer, wherein a frontside of the sensor layer is adjacent to the circuit layer and a backside of the sensor layer is adjacent to the insulating layer, the back-illuminated image sensor further including an imaging area comprising a plurality of photodetectors disposed in the frontside of the sensor layer, the method comprising:
   forming at least one shallow trench isolation (STI) region in the sensor layer, including thermal oxidation of the at least one STI region;
   forming an implanted sensor layer by implanting the sensor layer with an n-type dopant from the frontside and through the sensor layer to form an n-type well in the sensor layer adjacent to the backside of the sensor layer, wherein implanting the sensor layer with the n-type dopant occurs after the thermal oxidation of the at least one STI region to reduce thermal diffusion of dopants in the n-type well; and
   doping the implanted sensor layer with a p-type dopant to form the plurality of photodetectors doped with the p-type dopant in the frontside of the sensor layer.

2. The method of claim 1, wherein implanting the sensor layer with the n-type dopant to form the n-type well comprises implanting the sensor layer with an n-type dopant to form the n-type well in at least a portion of the sensor layer adjacent to the backside of the sensor layer.

3. The method of claim 2, wherein implanting the sensor layer with the n-type dopant to form the n-type well comprises chain implanting the sensor layer with the n-type dopant more than once to form a buried well in a portion of the sensor layer adjacent to the backside of the sensor layer.

4. The method of claim 3, further comprising the step of doping the sensor layer with an n-type dopant to form a first side well laterally adjacent to and on one side of each photodetector and a second side well laterally adjacent to and on the opposing side of each photodetector.

5. The method of claim 4, wherein the buried well and first and second side wells are formed such that a region doped with a p-type dopant is disposed between the buried well, each photodetector and the respective first and second side wells.

6. The method of claim 1, wherein forming the implanted sensor layer includes implanting the sensor layer with the n-type dopant such that the n-type well extends from the backside of the sensor layer to the frontside of the sensor layer, wherein the backside of the sensor layer forms an interface with the insulating layer.

* * * * *